United States Patent [19]
Entrikin

[11] Patent Number: 6,114,913
[45] Date of Patent: Sep. 5, 2000

[54] TRANSIMPEDANCE AMPLIFIERS WITH IMPROVED GAIN-BANDWIDTH PRODUCT

[75] Inventor: David W. Entrikin, Portland, Oreg.

[73] Assignee: Maxim Integrated Products, Inc, Sunnyvale, Calif.

[21] Appl. No.: 09/261,916

[22] Filed: Mar. 3, 1999

[51] Int. Cl.[7] .................................................. H03F 3/08
[52] U.S. Cl. ..................... 330/308; 330/311; 250/214 A
[58] Field of Search .................................. 330/257, 288, 330/308, 311; 250/214 A

[56] References Cited

U.S. PATENT DOCUMENTS 5,708,392  1/1998  Gross ........................................ 330/308

*Primary Examiner*—Robert Pascal
*Assistant Examiner*—Patricia T. Nguyen
*Attorney, Agent, or Firm*—Blakely, Sokoloff, Taylor & Zafman LLP

[57] ABSTRACT

Transimpedance amplifiers with improved gain-bandwidth products. The transimpedance amplifiers include a boost current circuit to increase the gain-bandwidth product of the transimpedance device, particularly useful when using low voltage power supplies. The boost current can be made responsive to the input current of the amplifier, better accommodating large input currents. The boost current may also be responsive to the power supply voltage, reducing the boost current with increasing power supply voltage. Various embodiments are disclosed.

25 Claims, 6 Drawing Sheets

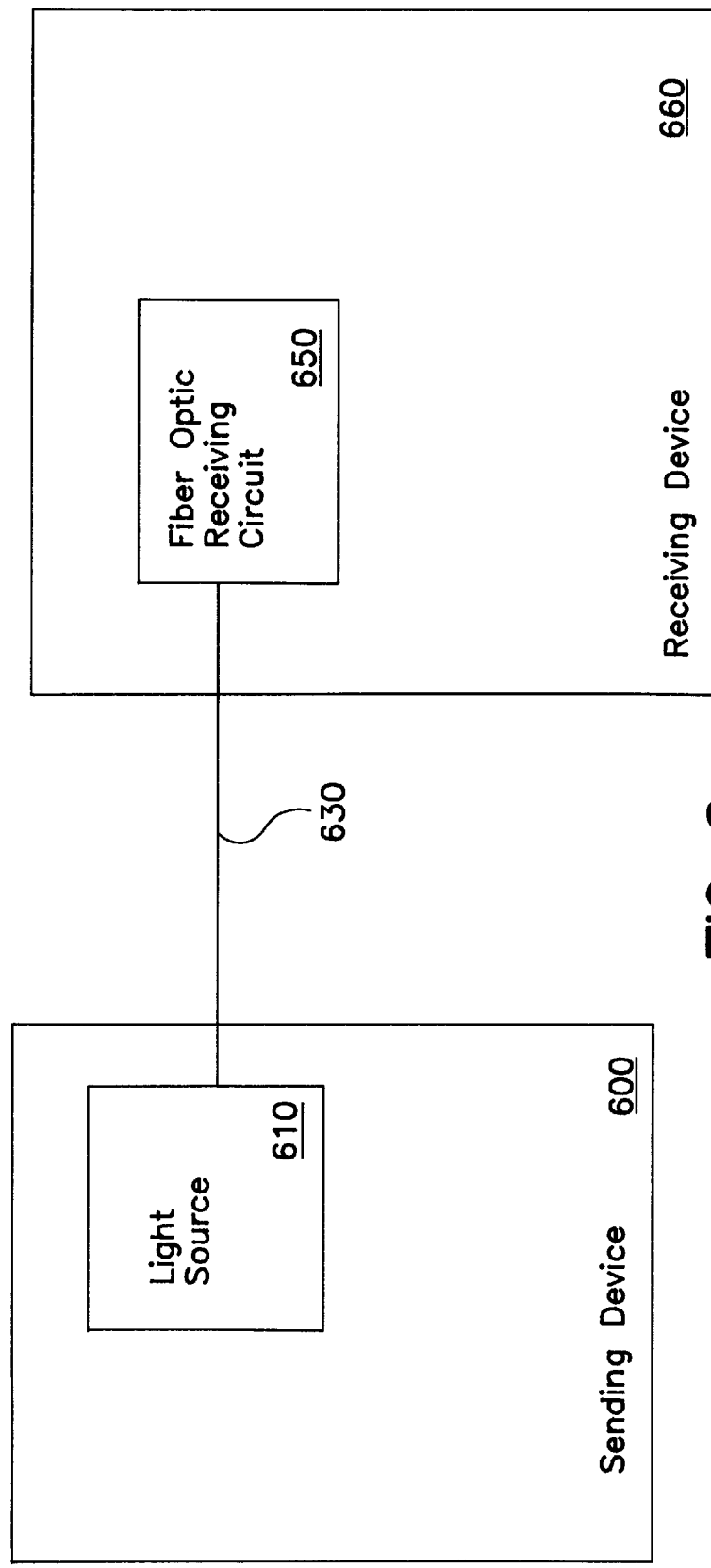

TRANSIMPEDANCE AMPLIFIERS WITH IMPROVED GAIN-BANDWIDTH PRODUCT

BACKGROUND OF THE INVENTION

1. Field of the Invention

The invention relates to amplifier circuits. More particularly, the invention relates to transimpedance amplifiers with improved gain-bandwidth products.

2. Prior Art

As described in greater detail below, the open loop gain of transimpedance amplifiers is reduced with lower operating voltages. This reduction in open loop gain results in lower gain-bandwidth product when other factors remain constant. As electronic systems move to lower operating voltages or power management or other purposes, the performance of transimpedance amplifiers included in the system decreases. The decreased performance of the transimpedance amplifier results in overall system performance decreases.

FIG. 1 is a circuit diagram of a transimpedance amplifier coupled to a photodiode. The circuit of FIG. 1 converts light modulated current in the photodiode to an output voltage ($V_{OUT}$). The circuit is useful, for example, for receiving data transmitted via fiber optic lines.

In general, the transimpedance gain of the circuit is given by $$\frac{R_{RT}}{1 + \frac{1}{AV}} \text{ohms} \qquad \text{(Equation 1)}$$

where $R_{RT}$ is the resistance of resistor RT and AV is the absolute open loop voltage gain of the amplifier portion of the circuit. In the circuit of FIG. 1, the open loop voltage gain is the voltage gain from the base of Q1 to the emitter of Q3 with RT removed. Because thermal noise current generated by resistor RT is a dominant noise source and limits sensitivity of the transimpedance amplifier, it is advantageous to make resistor RT as large as possible to reduce the corresponding noise current contribution. Current noise in RT is given by:

$$\overline{i^2} = 4kT \frac{1}{R_{RT}} \Delta f \qquad \text{(Equation 2)}$$

where k is Boltzmann's constant, T is temperature, and $\Delta f$ is the frequency band. Thus, increasing the resistance of RT decreases current noise.

High open loop gain allows the resistor RT to be made larger, and therefore less noisy, without sacrificing bandwidth because the resistance of resistor RT as seen from the input of the transimpedance amplifier is divided by 1+AV as a result of feedback. Because the bandwidth of the transimpedance amplifier is inversely proportional to the product of the input capacitance and the input resistance, the reduction of $R_{RT}$ by a factor of 1+AV allows $R_{RT}$ to be very large while maintaining a high bandwidth for the transimpedance amplifier.

The open loop gain of the circuit of FIG. 1 is approximately $$abs(-gm_{Q1} R_{RL}) \qquad \text{(Equation 3)}$$

where $gm_{Q1}$ is the transconductance of transistor Q1 and $R_{RL}$ is the resistance of resistor RL (e.g., load resistance). Given $$gm_{Q1} = \frac{I_{C_{Q1}}}{V_t} \qquad \text{(Equation 4)}$$

where $I_{C_{Q1}}$ is the collector current of transistor Q1 and $V_T$ is the thermal voltage, $kT/q$, and $$I_{C_{Q1}} = \frac{V_{CC} - 2V_{BE}}{R_{RL}} \qquad \text{(Equation 5)}$$

when the current in photodiode is zero, where $V_{CC}$ is the supply voltage and $V_{BE}$ is the voltage between the base and the emitter of transistor Q1 or Q3, the open loop gain of the transimpedance amplifier can be expressed as:

$$AV = abs(-gm_{Q1} R_{RL}) = \left(\frac{I_{C_{Q1}}}{V_t}\right) R_{RL} = \frac{V_{CC} - 2V_{BE}}{V_t} \qquad \text{(Equation 6)}$$

Thus, the open loop gain of the transimpedance amplifier is largely a function of the supply voltage. Transistor Q3 forms an emitter follower that allows the output of the circuit to have a relatively low impedance. Current source I1 biases transistor Q3 to operate for the full range of output voltages.

In an implementation having a 5 Volt supply voltage and $V_{BE} \approx 0.8$ at room temperature, $$AV = \frac{5V - 1.6V}{26mV} 131 V/V.$$

With a 3 Volt supply voltage, however, AV drops to about 54V/V. This gain reduction results in either lower bandwidth if the circuit is not changed or more noise if $R_{RT}$ is decreased to improve bandwidth.

SUMMARY OF THE INVENTION

Transimpedance amplifiers with improved gain-bandwidth products. The transimpedance amplifiers include a boost current circuit to increase the gain-bandwidth product of the transimpedance device, particularly useful when using low voltage power supplies. The boost current can be made responsive to the input current of the amplifier, better accommodating large input currents. The boost current may also be responsive to the power supply voltage, reducing the boost current with increasing power supply voltage. Various embodiments are disclosed, the exemplary embodiments being disclosed in junction transistor form for amplifying the current output of a photodiode.

BRIEF DESCRIPTION OF THE DRAWINGS

The invention is illustrated by way of example, and not by way of limitation in the figures of the accompanying drawings in which like reference numerals refer to similar elements.

FIG. 6 is a block diagram of a fiber optic system having a transimpedance amplifier circuit according to the invention.

DETAILED DESCRIPTION

Transimpedance amplifiers with improved gain-bandwidth product are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

By providing additional current ($I_{boost}$), the invention provides improved gain-bandwidth product for transimpedance amplifiers. A transimpedance amplifier with improved gain-bandwidth product can be used, for example, to decrease operating voltages of fiber optic systems while improving overall performance. Because decreased operating voltages would otherwise result in decreased gain-bandwidth product, the invention allows lower power, higher performance systems. In one embodiment, the additional current is supplied to the collector of an input transistor in the transimpedance Amplifier. The current can be controlled with a voltage controlled current source to provide an approximately constant gain-bandwidth across a range of supply voltage levels.

Figure 1:
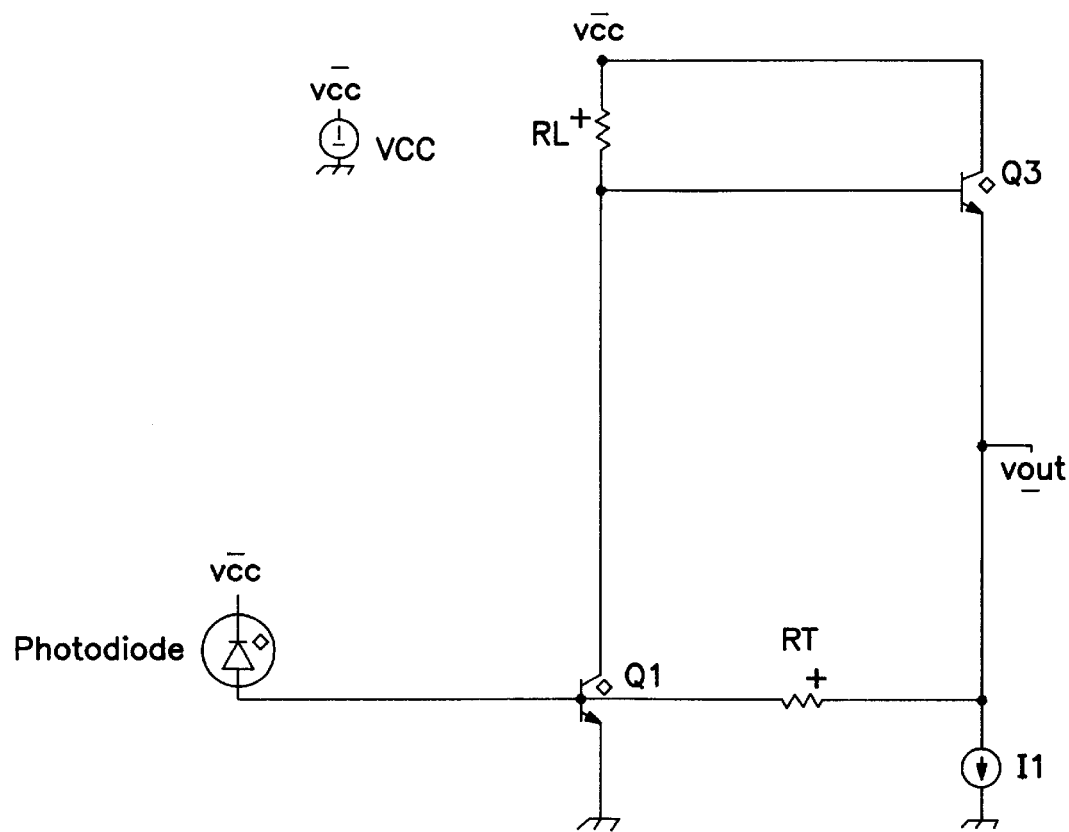
FIG. 1 is a circuit diagram of a prior art transimpedance amplifier coupled to a photodiode.
Figure 2:
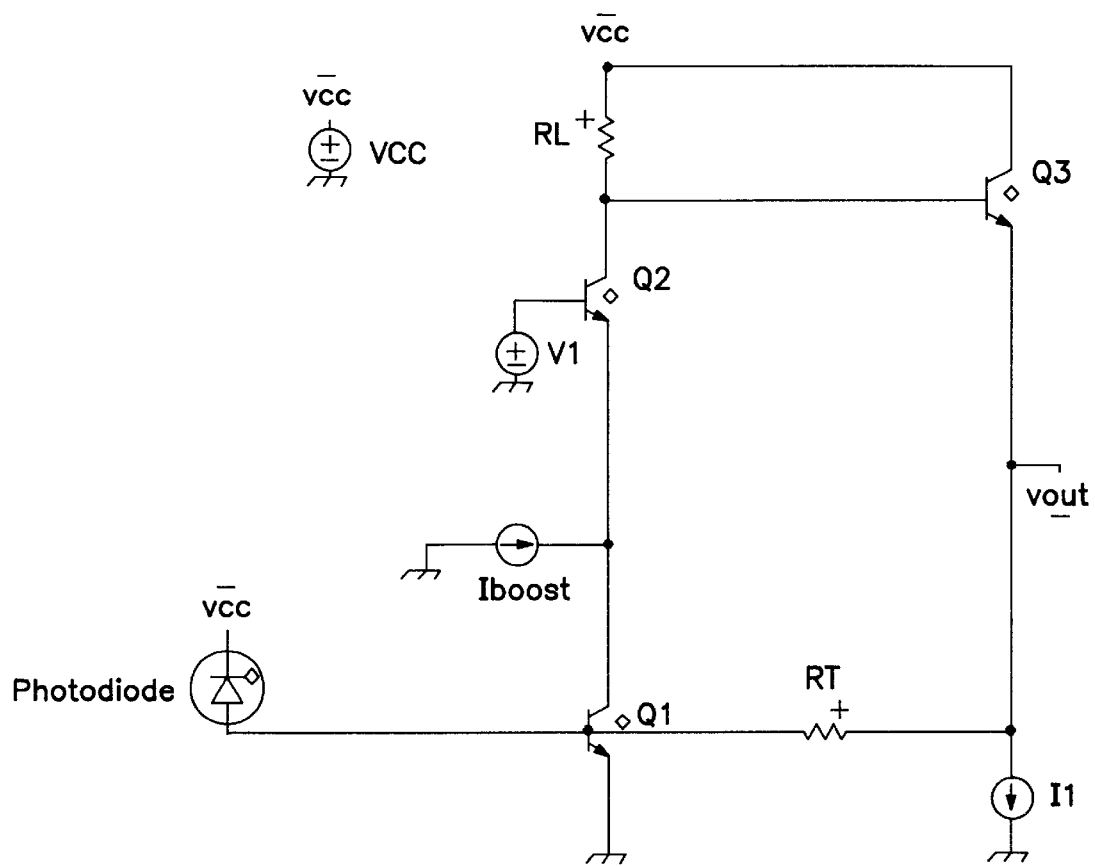
FIG. 2 is a circuit diagram of one embodiment of a transimpedance amplifier coupled to a photodiode where the transimpedance amplifier provides an improved gain-bandwidth product by way of an ideal current source.

FIG. 2 is a circuit diagram of one embodiment of transimpedance amplifier in accordance with the present invention having an improved gain-bandwidth product. The circuit of FIG. 2 comprises the circuit FIG. 1 with the addition of cascode transistor Q2, and an additional current source Iboost providing an additional current component $I_{boost}$. Voltage source V1 provides a bias voltage level for cascode transistor Q2. In this circuit, the photodiode is coupled to the base of the input transistor Q1. The collector current requirements for transistor Q1 are provided in part by the boost current source Iboost and in part by the current through the load resistor RL and transistor Q2. The signal current through transistor Q1 is provided through the load resistor RL and transistor Q2, the boost current being independent of the signal, or at least substantially independent of the AC part of the signal. As in FIG. 1, transistor Q3 is connected as an emitter follower to provide the output $V_{OUT}$ responsive to the voltage drop across the resistor RL, with the current source I1 providing pull down current for the output $V_{OUT}$ and the emitter of transistor Q3, and resistor RT providing feedback of the transimpedance amplifier output to the input thereof.

The current source Iboost increases the open loop voltage gain of the circuit of FIG. 2 as compared the circuit of FIG. 1 by $$\frac{R_{RL} I_{boost}}{V_t}.$$

Thus, the open loop voltage gain of the transimpedance amplifier becomes $$AV = \frac{V_{CC} - 2V_{BE} + R_{RL} I_{boost}}{V_t} \qquad \text{(Equation 7)}$$

If, for example, $I_{BOOST}$ is designed to be equal to the current flowing through cascode transistor Q2, the open loop gain of the circuit can be doubled as compared to the open loop gain of the circuit of FIG. 1. The value of $I_{boost}$ can be chosen based on open loop gain requirements for a specific environment. In one embodiment, cascode transistor Q2 provides 0.5 mA of current to transistor Q1 and $I_{boost}$ is 0.5 mA; however, other values and ratios can also be used.

For large input signal current excursions from the photodiode, the transient current in transistor Q1 can dip to less than $I_{boost}$, which can increase the collector voltage of transistor Q1 to a level high enough to reverse bias the base-emitter junction of transistor Q2, resulting in junction breakdown and possible damage to transistor Q2. Also, severe switching of transistor Q2 can result in pulse width distortion of the output $V_{OUT}$.

Figure 3:
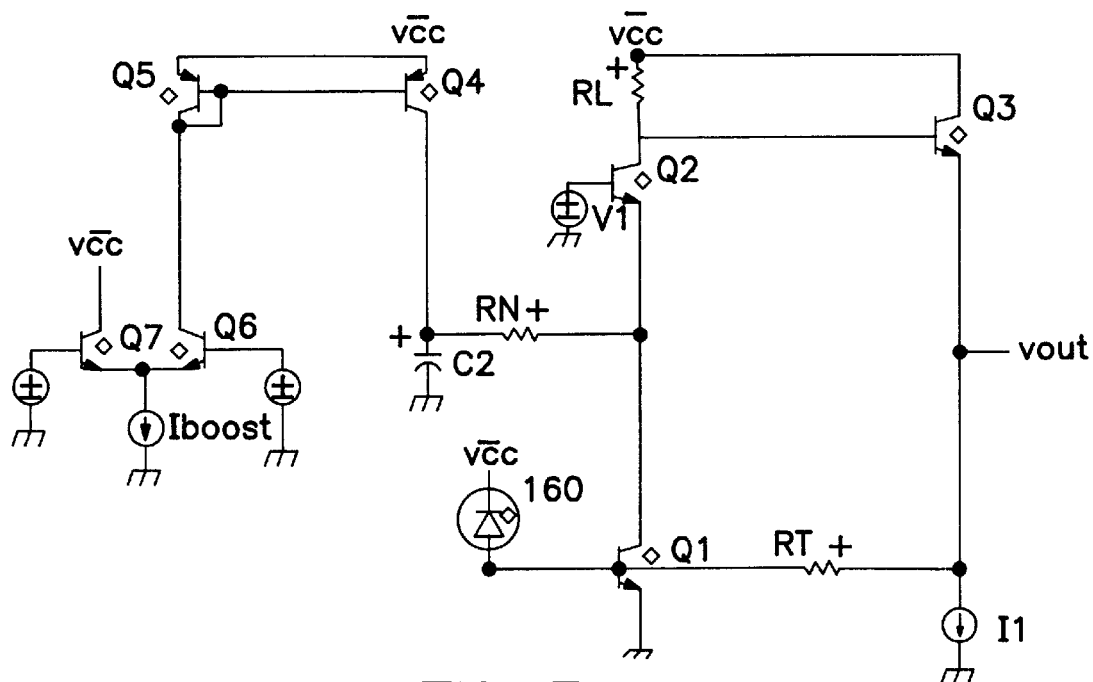
FIG. 3 is a circuit diagram of one embodiment of a transimpedance amplifier coupled to a photodiode where the transimpedance amplifier provides an improved gain-bandwidth product by way of a realizable current source.

FIG. 3 is a circuit diagram of one embodiment of a transimpedance amplifier coupled to a photodiode where the transimpedance amplifier provides an improved gain-bandwidth product. Differential transistor pair Q6 and Q7 steer a current $I_{BOOST}$ from the current source $I_{boost}$ through transistors Q6 and Q7 in a proportion relative to the voltages on the bases of the transistor pair. The current through transistor Q6 is mirrored by transistors Q5 and Q4 to the collector of transistor Q1 through resistor RN. Capacitor C2 filters this input to reduce noise. Preferably resistor RN is much larger than the impedance looking into the emitter of cascode transistor Q2 so that little signal current is shunted through resistor RN.

Figure 4:
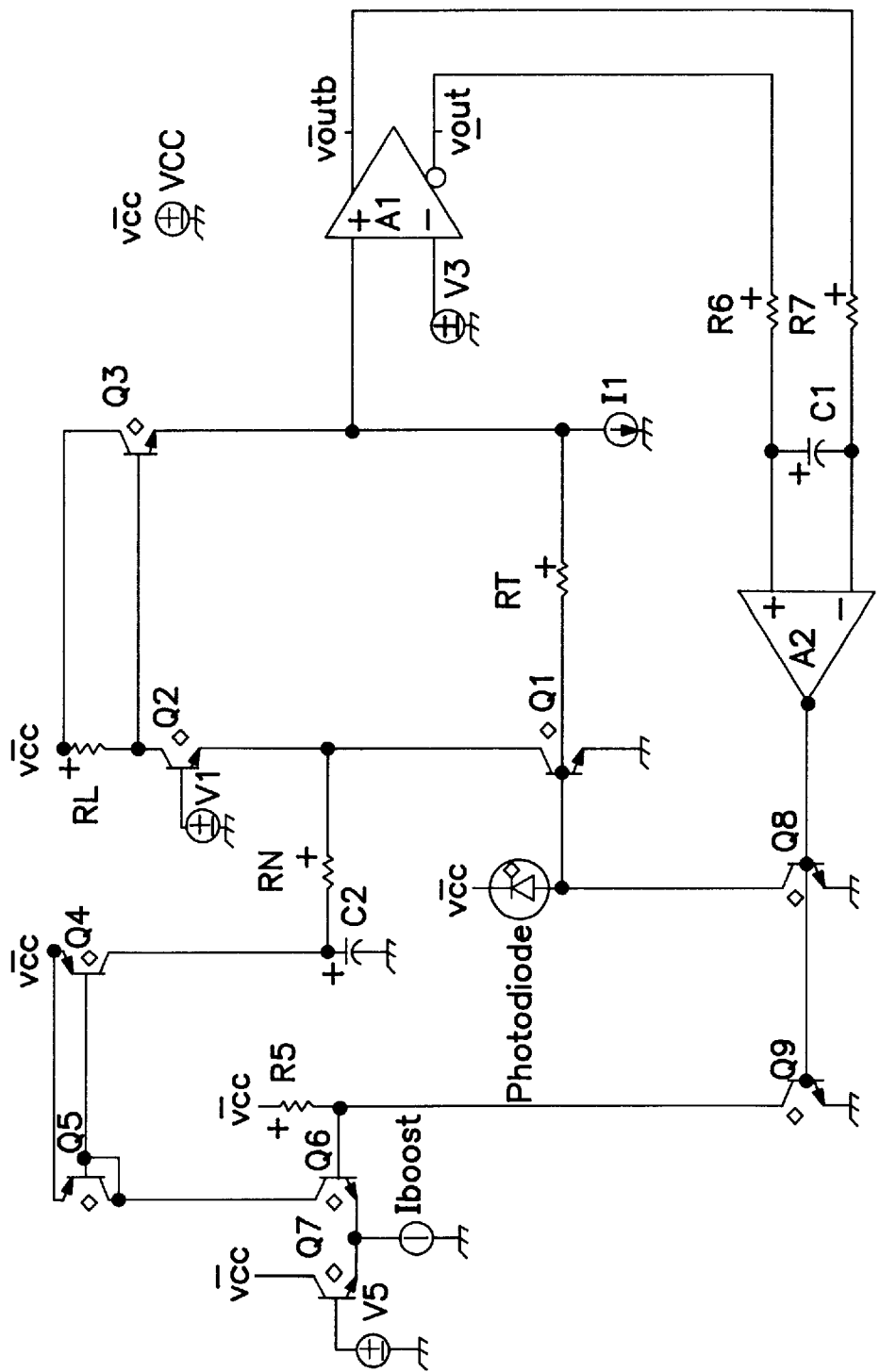
FIG. 4 is a circuit diagram of one embodiment of a transimpedance amplifier coupled to a photodiode where the transimpedance amplifier has a feedback loop and provides an improved gain-bandwidth product when necessary, as a function of the input current.

FIG. 4 is a circuit diagram of one embodiment of a transimpedance amplifier coupled to a photodiode where the transimpedance amplifier has a feedback loop and provides an improved gain-bandwidth product. This circuit has improved large signal characteristics over the circuit of FIG. 2. In this circuit, the boost current is reduced via feedback as the average photodiode current increases to prevent the situation described above where the transient current in Q1 is less than Iboost. In particular, in the exemplary circuit of FIG. 4, output amplifier A1 having a differential input and a differential output provides a differential output $V_{OUT}$, $V_{OUTB}$, each of which has an amplitude dependent on the amplitude of the signal input to the amplifier A1, and each of which has an average value based on the difference between the output (emitter voltage) of transistor Q3 and a reference or desired common mode output voltage V3. This differential output is low pass filtered by resistors R6 and R7 and capacitor C1 to substantially entirely remove the AC signal content therefrom, and the remaining DC content is amplified and converted to a single ended control signal by amplifier A2. The output of amplifier A2 controls the base voltage of transistors Q8 and Q9, setting the current there through. The current through transistor Q8 subtracts the average (DC) photodiode current from the input to hold the average of the differential output voltage $V_{OUT}-V_{OUTB}$ at zero.

The current through transistor Q9 determines the voltage drop across resistor R5 and thus the collector voltage of transistor Q9. Differential transistor pair Q6, Q7 steers the current IBOOST through transistors Q6 and Q7 in accordance with the relative voltages on the collector of transistor Q9 and the reference voltage $V_5$, with the component of Iboost steered through transistor Q6 being mirrored by transistors Q5 and Q4 to the collector of transistor Q1 through resistor RN to control the actual boost current provided to the collector of transistor Q1. Again, capacitor C2 filters this input to reduce noise, with resistor RN preferably being much larger than the impedance looking into the emitter of cascode transistor Q2 so that little signal current is shunted through resistor RN.

In operation, the feedback to the base of transistor Q8 serves to subtract the average (DC) current flowing in the photodiode from the input of the transimpedance amplifier via the collector of transistor Q8. Because the resistor RT is a large resistor and the base current of transistor Q1 is small, transistor Q8 will conduct substantially all of the average current from the photodiode, subtracting the same from the amplifier input so that the average transimpedance amplifier input will be substantially zero. This allows for differential operation, larger output swings and less pulse-width distortion. (Input current from photodiode can be centered around a value other than zero if desired.) At the same time, the feedback to the base of transistor Q9 controls the actual boost current provided to the collector of transistor Q1 to reduce the boost current provided to the collector of transistor Q1 with increasing average (DC) photodiode current. In that regard, an increase in the output voltage of amplifier A2 increases the current through both transistors Q8 and Q9. The increase in current through transistor Q8 responds to increased average (DC) photodiode current, while the increase in current through transistor Q9 increases the voltage drop across resistor R5, reducing the base voltage on transistor Q6 to steer more current through transistor Q7 and less through transistor Q6, reducing the boost current provided to the collector of transistor Q1.

Figure 5:
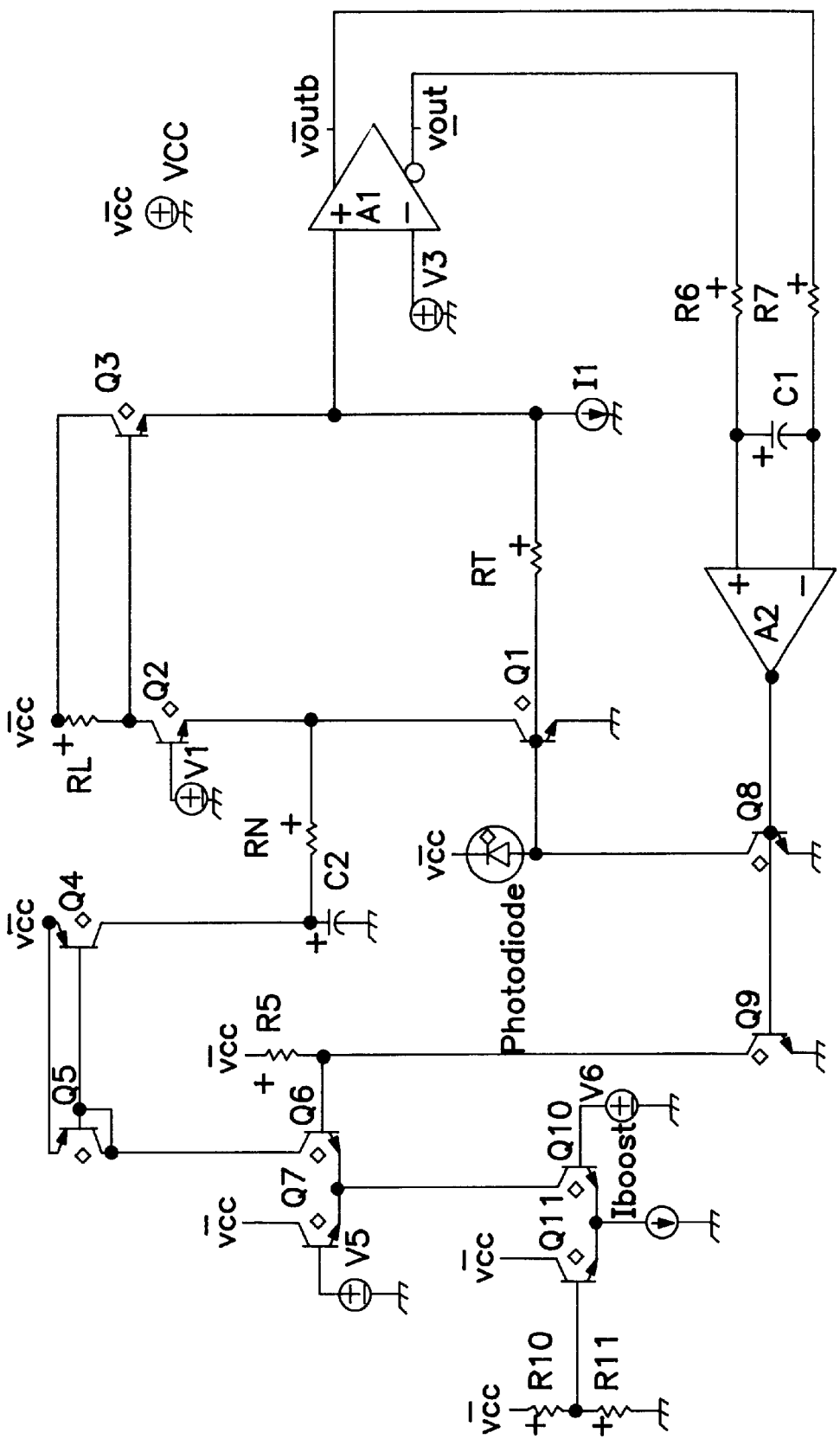
FIG. 5 is a circuit diagram of one embodiment of a transimpedance amplifier coupled to a photodiode where the transimpedance amplifier has a feedback loop and provides an improved gain-bandwidth product when necessary, as a function of input current and supply voltage.

FIG. 5 is a circuit diagram of one embodiment of a transimpedance amplifier coupled to a photodiode where the transimpedance amplifier has a feedback loop and a voltage controlled current source and provides an improved gain-bandwidth product. The circuit of FIG. 5 is similar to that of FIG. 4 and includes a voltage controlled current source providing current to transistors Q6 and Q7 to allow the circuit to operate with multiple supply voltages ($V_{CC}$) while providing an approximately constant gain-bandwidth product. In other words, $I_{boost}$ is reduced and eventually turned off in response to increases in $V_{CC}$.

The differential pair formed by transistors Q10 and Q11 operate to reduce the component of the current IBOOST supplied by current source Iboost to the differential pair Q6, Q7 as the supply voltage $V_{CC}$ increases. In one embodiment, resistors R10 and R11 form a voltage divider that provides a voltage to the base of transistor Q11 that is a constant percentage of $V_{CC}$. Voltage supply V6 provides a constant voltage to the base of transistor Q10. The control provided by the voltage controlled current source allows control of the current that passes through transistor Q1, which determines the open loop gain of the transimpedance amplifier of the circuit of FIG. 5 to be maintained at a fixed, desired level over a wide range of supply voltages. This control reduces the boost current component in transistor Q1 with high supply voltages as the current component through Q2 and RL increase with supply voltage, and this reduction results in decreased input referred current noise due to base current and collector current shot noise. It also avoids the large signal problems associated with the current of FIG. 2.

FIG. 6 is a block diagram of a fiber optic system having a transimpedance amplifier circuit according to the invention. FIG. 6 represents one environment for the circuits described above; however, the transimpedance amplifier of the invention can be used for any transimpedance amplifier application with or without input from a photodiode.

Sending device 600 is any device configured to send information via fiber optic cable. Sending device 600 can be, for example, a telecommunications device. Sending device 600 includes light source 610 that is configured to communicate information using light in any manner known in the art.

Fiber optic cable 630 provides a communications path between sending device 600 and receiving device 660. Receiving device 660 includes fiber optic receiving circuit 650 to receive data from fiber optic cable 630. In one embodiment, fiber optic receiving circuit 650 includes a transimpedance amplifier according to the invention coupled to a photodiode.

Of course, sending device 600 can include multiple light sources and be coupled to multiple receiving devices (not shown in FIG. 6). Similarly, receiving device 660 can include multiple fiber optic receiving circuits having varying implementations and receiving device 660 can be coupled to multiple sending devices (not shown in FIG. 6).

In the foregoing specification, the invention has been described with reference to specific embodiments thereof. It will, however, be evident that various modifications and changes can be made thereto without departing from the broader spirit and scope of the invention. By way of example, the invention has been shown and described with respect to specific bipolar transistor circuits, though other circuits and other transistor types or the same transistor types but of opposite conductivity type can also be used if desired as applicable to the specific application of the invention. By way of but one example, the present invention may be realized using MOS devices if desired. Thus, the specification and drawings are, accordingly, to be regarded in an illustrative rather than a restrictive sense.

What is claimed is:

1. A transimpedance amplifier comprising:
    a semiconductor device having first and second electrodes and a control electrode, the control electrode being coupled to an input for the transimpedance amplifier to control the current flow from the first to the second electrode through the semiconductor device responsive to the input current in the transimpedance amplifier input;
    a resistor coupled to the first electrode and having a current through the resistor also flowing through the first and second electrodes of the semiconductor device, the current through the resistor providing a transimpedance amplifier output voltage responsive to the current in the transimpedance amplifier input; and,
    a boost current source coupled to the second electrode, the boost current source providing an additional current component through the first and second electrodes of the semiconductor device, which additional current component does not flow through the resistor and which additional current component is substantially independent of the instantaneous input current.

2. The transimpedance amplifier of claim 1 further comprised of a first feedback circuit controlling the value of the additional current component responsive to an average of the transimpedance amplifier input current.

3. The transimpedance amplifier of claim 2 further comprised of a power supply voltage sensitive circuit coupled to a power supply powering the transimpedance amplifier and controlling the value of the additional current component responsive to the power supply voltage.

4. The transimpedance amplifier of claim 3 wherein the semiconductor device is an npn junction transistor.

5. A transimpedance amplifier for coupling between first and second supply voltages comprising:
   a first semiconductor device having first and second electrodes and a control electrode, the control electrode being coupled to an input for the transimpedance amplifier to control the current flow through the first and second electrodes responsive to the current in the transimpedance amplifier input;
   a second semiconductor device having first and second electrodes and a control electrode, the current flow from the first to the second electrode through the second semiconductor device being responsive to the voltage between the control electrode and the second electrode of the second semiconductor device;
   a first resistor coupled between the first supply terminal and the first electrode of the second semiconductor device;
   the second semiconductor device having its control electrode coupled to a reference voltage and its second electrode coupled to the first electrode of the first semiconductor device, the second electrode of the first semiconductor device being coupled to the second supply terminal;
   a boost current source coupled to the first electrode of the first semiconductor device, the boost current source providing an additional current component through the first and second electrodes of the first semiconductor device which additional current component does not pass through the first resistor;
   the current through the first resistor providing a transimpedance amplifier output voltage responsive to the current in the transimpedance amplifier input.

6. The transimpedance amplifier of claim 5 further comprised of a first feedback circuit controlling the value of the additional current component responsive to an average of the transimpedance amplifier input current.

7. The transimpedance amplifier of claim 6 further comprised of a power supply voltage sensitive circuit coupled to the first and second power supply voltages and controlling the value of the additional current component responsive to the first and second power supply voltages.

8. The transimpedance amplifier of claim 7 wherein the semiconductor device is an npn junction transistor.

9. The transimpedance amplifier of claim 5 further comprising an output circuit coupled to the first resistor, the output circuit providing the transimpedance amplifier output voltage responsive to the current through the first resistor.

10. The transimpedance amplifier of claim 9 further comprised of a feedback resistor coupled between the transimpedance amplifier output voltage and the transimpedance amplifier input.

11. The transimpedance amplifier of claim 10 further comprised of a boost current control circuit controlling the boost current responsive to an average value of the transimpedance amplifier input current.

12. The transimpedance amplifier of claim 11 wherein the boost current control circuit further controls the boost current responsive to the first and second supply voltages.

13. The transimpedance amplifier of claim 10 further comprised of a boost current control circuit controlling the boost current responsive to the first and second supply voltages.

14. A transimpedance amplifier for coupling between first and second supply voltages comprising:
   a first semiconductor device having first and second electrodes and a control electrode, the control electrode being coupled to an input for the transimpedance amplifier to control the current flow through the first and second electrodes responsive to the current in the transimpedance amplifier input;
   a second semiconductor device having first and second electrodes and a control electrode, the current flow from the first to the second electrode through the second semiconductor device being responsive to the voltage between the control electrode and the second electrode of the second semiconductor device;
   a first resistor coupled between the first supply terminal and the first electrode of the second semiconductor device;
   the second semiconductor device having its control electrode coupled to a reference voltage and its second electrode coupled to the first electrode of the first semiconductor device, the second electrode of the first semiconductor device being coupled to the second supply terminal;
   a boost current source coupled through first and second circuits to the first electrode of the first semiconductor device, the boost current source providing an additional current component through the first and second electrodes of the first semiconductor device which additional current component does not pass through the first resistor;
   the first circuit reducing the additional current component through the first and second electrodes of the first semiconductor device responsive to increasing voltage difference between the first and second supply voltages;
   a transimpedance amplifier output circuit providing a transimpedance amplifier output responsive to the current through the first resistor;
   a feedback resistor coupled between the transimpedance amplifier output voltage and the transimpedance amplifier input;
   a third circuit providing a feedback signal responsive to the average transimpedance amplifier input current;
   the second circuit further controlling the additional current component through the first and second electrodes of the first semiconductor device responsive to the feedback signal of the third circuit; and,
   a fourth circuit controlling the average current into the transimpedance amplifier input responsive to the feedback signal of the third circuit.

15. The transimpedance of claim 14 wherein the first and second semiconductor devices are junction transistors.

16. The transimpedance amplifier of claim 15 wherein the junction transistors are npn transistors.

17. The transimpedance amplifier of claim 15 further comprised of a photoconductor coupled to the transimpedance amplifier input.

18. The transimpedance amplifier of claim 17 wherein the photoconductor is a photodiode.

19. The transimpedance of claim 14 wherein the first circuit comprises a differential pair of transistors coupled as a current steering circuit.

20. The transimpedance of claim 14 wherein the second circuit comprises a differential pair of transistors coupled as a current steering circuit.

21. The transimpedance of claim 14 wherein the first and second circuits each comprise a differential pair of transistors coupled as a current steering circuit.

22. A transimpedance amplifier comprising:

a semiconductor device having first and second electrodes and a control electrode, the control electrode being coupled to an input for the transimpedance amplifier to control the current flow from the first to the second electrode through the semiconductor device responsive to the input current in the transimpedance amplifier input;

a resistor coupled to the first electrode and having a current through the resistor also flowing through the first and second electrodes of the semiconductor device, the current through the resistor providing a transimpedance amplifier output voltage responsive to the current in the transimpedance amplifier input; and, a boost current source coupled to the second electrode, the boost current source providing an additional current component through the first and second electrodes of the semiconductor device, which additional current component does not flow through the resistor and is responsive to the average value of the input current.

23. The transimpedance amplifier of claim 22 further comprised of a first feedback circuit controlling the value of the additional current component responsive to an average of the transimpedance amplifier input current.

24. The transimpedance amplifier of claim 23 further comprised of a power supply voltage sensitive circuit coupled to a power supply powering the transimpedance amplifier and controlling the value of the additional current component responsive to the power supply voltage.

25. The transimpedance amplifier of claim 24 wherein the semiconductor device is an npn junction transistor.

* * * * *